(12) United States Patent
Jordan

(10) Patent No.: US 8,890,598 B2
(45) Date of Patent: Nov. 18, 2014

(54) MULTIPLE RAMP VARIABLE ATTENUATOR

(71) Applicant: Edward Perry Jordan, Kernersville, NC (US)

(72) Inventor: Edward Perry Jordan, Kernersville, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/750,729

(22) Filed: Jan. 25, 2013

(65) Prior Publication Data

US 2014/0210538 A1 Jul. 31, 2014

(51) Int. Cl.
*H03L 5/00* (2006.01)

(52) U.S. Cl.
CPC .................................. *H03L 5/00* (2013.01)
USPC .......................................... 327/308; 333/81 R

(58) Field of Classification Search
CPC .......................... H03H 11/24; H03H 11/245
USPC .......................................... 327/308; 333/81 R
See application file for complete search history.

(56) References Cited

U.S. PATENT DOCUMENTS

| | | | |
|---|---|---|---|
| 4,489,270 A | 12/1984 | Diller | |
| 4,875,023 A | 10/1989 | Maoz | |
| 4,912,394 A | 3/1990 | Sugimoto et al. | |
| 4,978,932 A | 12/1990 | Gupta et al. | |
| 5,049,841 A * | 9/1991 | Cooper et al. | 333/81 R |
| 5,448,207 A * | 9/1995 | Kohama | 333/81 R |
| 5,563,557 A | 10/1996 | Sasaki | |
| 5,666,089 A * | 9/1997 | Ehlers | 333/81 R |
| 5,796,286 A * | 8/1998 | Otaka | 327/308 |
| 5,912,599 A | 6/1999 | Beall | |
| 6,300,814 B1 | 10/2001 | Takahashi | |
| 6,828,873 B2 * | 12/2004 | Ludwig et al. | 333/81 R |
| 7,205,817 B1 * | 4/2007 | Huang et al. | 327/308 |
| 7,525,395 B2 * | 4/2009 | Hwang et al. | 333/81 R |
| 7,532,086 B2 * | 5/2009 | Ju et al. | 333/81 A |
| 7,839,233 B2 | 11/2010 | Zhao et al. | |
| 8,131,241 B2 | 3/2012 | McCarthy et al. | |
| 8,674,746 B1 * | 3/2014 | Staudinger | 327/333 |
| 8,779,870 B2 * | 7/2014 | Sun et al. | 333/81 R |
| 2003/0160599 A1 | 8/2003 | Mouret | |
| 2005/0174157 A1 | 8/2005 | Calo' et al. | |
| 2009/0091304 A1 | 4/2009 | Yang | |
| 2010/0019749 A1 | 1/2010 | Katsuya | |
| 2012/0280738 A1 | 11/2012 | Granger-Jones et al. | |
| 2014/0002214 A1 * | 1/2014 | Bawell et al. | 333/81 R |

OTHER PUBLICATIONS

International Search Report and Written Opinion in PCT Application Serial No. PCT/US2014/012697 mailed on May 27, 2014, 9 pages.

* cited by examiner

*Primary Examiner* — William Hernandez
(74) *Attorney, Agent, or Firm* — Patent Capital Group

(57) ABSTRACT

The present disclosure provides an attenuator and associated methods of operations. An exemplary attenuator includes an input terminal, an output terminal, a voltage reference terminal, a first attenuation segment coupled with the input terminal and the output terminal, and a second attenuation segment coupled with the first attenuation segment and the voltage reference terminal. The attenuator further includes at least two switches coupled with the input terminal and the output terminal in parallel with the first attenuation segment, where at least some of the at least two switches have an associated voltage control terminal. For example, the attenuator includes a first switch and a second switch coupled with the input terminal and the output terminal in parallel with the first attenuation segment, wherein a first voltage control terminal is coupled with the first switch and a second voltage control terminal is coupled with the second switch.

20 Claims, 3 Drawing Sheets

MULTIPLE RAMP VARIABLE ATTENUATOR

TECHNICAL FIELD

The present disclosure relates generally to attenuators, and more particularly, to variable attenuators.

BACKGROUND

Attenuators are electronic devices configured to decrease a signal property (for example, current, voltage, power, other signal property, or a combination thereof) of an incoming electrical signal. Such devices are particularly useful in applications (such as radio frequency applications) needing lower voltage, dissipated power, and/or impedance matching. One type of attenuator is a variable attenuator that provides various degrees of attenuation. Switch devices implemented in the variable attenuator can be turned on and off to achieve the various levels of attenuation, however, such switch devices often contribute undesirable distortion and insertion loss. Accordingly, although existing attenuators have been generally adequate for their intended purposes, they have not been entirely satisfactory in all respects.

BRIEF DESCRIPTION OF DRAWINGS

The present disclosure is best understood from the following detailed description when read with the accompanying figures. It is emphasized that, in accordance with the standard practice in the industry, various features are not drawn to scale and are used for illustration purposes only. In fact, the dimension of the various features may be arbitrarily increased or reduced for clarity of discussion.

OVERVIEW OF EXAMPLE EMBODIMENTS

Figure 1:
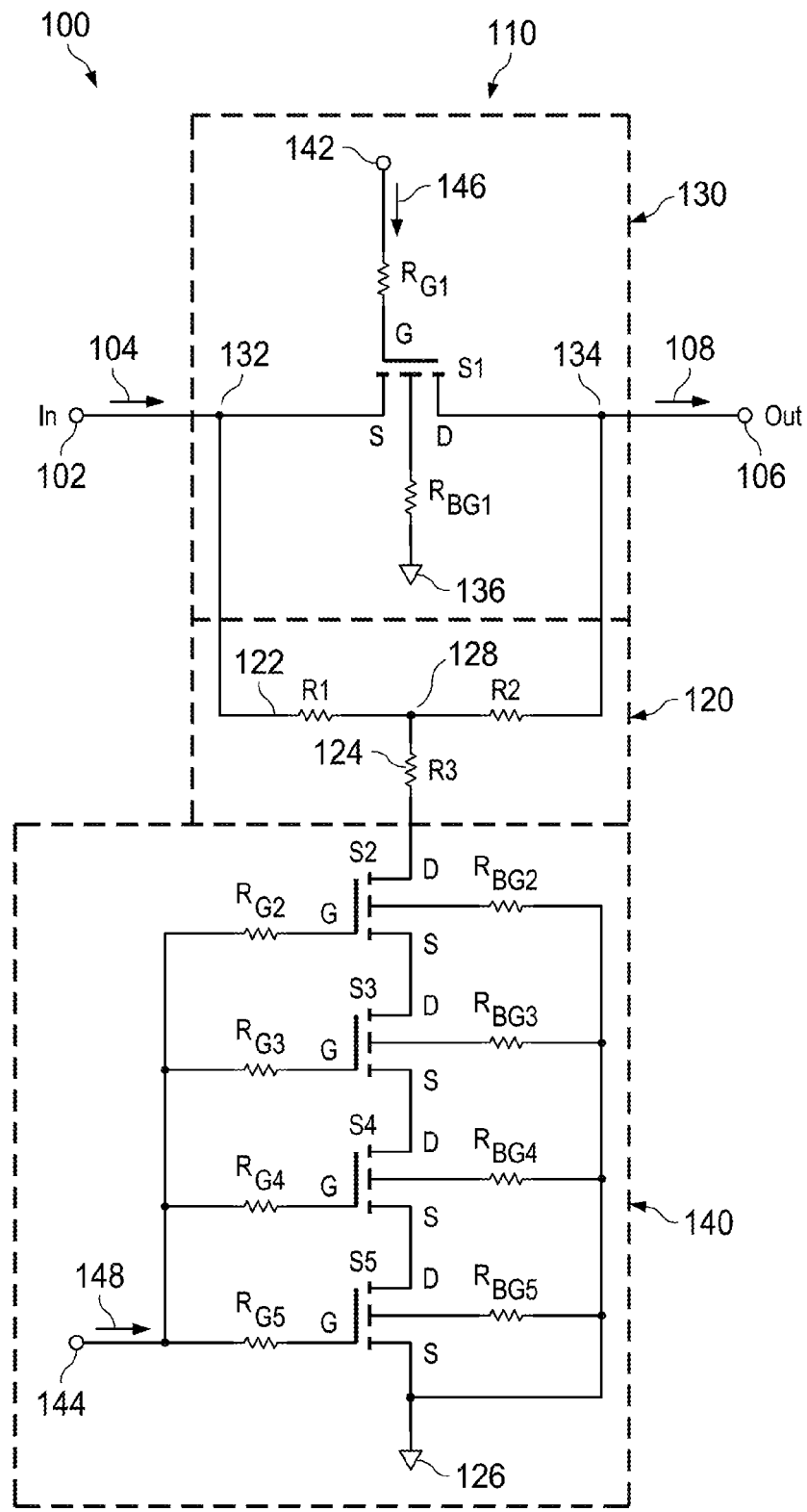
FIG. 1 is a schematic circuit diagram of an exemplary attenuator according to various aspects of the present disclosure.

In various implementations, an exemplary attenuator includes an input terminal, an output terminal, a voltage reference terminal, a first attenuation segment coupled with the input terminal and the output terminal, and a second attenuation segment coupled with the first attenuation segment and the voltage reference terminal. The attenuator further includes at least two switches coupled with the input terminal and the output terminal in parallel with the first attenuation segment, where at least some of the at least two switches have an associated voltage control terminal. For example, the attenuator includes a first switch and a second switch coupled with the input terminal and the output terminal in parallel with the first attenuation segment, wherein a first voltage control terminal is coupled with the first switch and a second voltage control terminal is coupled with the second switch. In various implementations, the attenuator is configured such that the first voltage control terminal and the second voltage control signal respectively transition the first switch and the second switch from a first state to a second state in a staggered manner. The attenuator can further include a third switch coupled with the second attenuation segment in series, wherein a third voltage control terminal is coupled with the third switch. The first switch, the second switch, and/or the third switch can be a field effect transistor. The voltage reference terminal can be a ground terminal.

In various implementations, the attenuator further includes at least one more switch coupled between the input terminal and the output terminal in parallel with the first attenuation segment, wherein the at least one more switch is coupled with an associated voltage control terminal. In various implementations, the attenuator further includes at least one more switch coupled with the second attenuation segment in series, wherein the at least one more switch is coupled with the third voltage control terminal. In various implementations, a gate of the first switch can be coupled with the first voltage control terminal through a resistor, a gate of the second switch can be coupled with the second voltage control terminal through a resistor, a back gate of the first switch can be coupled with a first voltage reference terminal through a resistor, and a back gate of the second switch can be coupled with a second voltage reference terminal through a resistor. In various implementations, the first attenuation segment and the second attenuation segment are a portion of a tee attenuator section, a pi attenuator section, a bridged tee attenuator section, or any other type of attenuator section.

In various implementations, an exemplary integrated circuit includes an input terminal; an output terminal; and an attenuator circuit coupled with the input terminal and the output terminal. The attenuator circuit includes a first attenuation segment coupled with the input terminal and the output terminal; a second attenuation segment coupled with the first attenuation segment and a voltage reference terminal; and a first switch device coupled between the input terminal and the output terminal in parallel with the first attenuation segment, wherein the first switch device includes at least two switches, wherein the at least two switches have respective voltage control terminals. The integrated circuit can further include a source circuit and a load circuit, wherein the attenuator circuit outputs an output signal to the load circuit that is attenuated relative to an incoming signal received from the source circuit.

In various implementations, the attenuator circuit is configured such that the voltage control terminals transition the at least two switches from a first state to a second state in a staggered manner. The at least two switches can be field effect transistors. In various implementations, the integrated circuit further includes a second switch device coupled with the second attenuation segment in series. The second switch device can be coupled with a respective voltage control terminal. In various implementations, the attenuator section is a pi attenuator, a tee attenuator, a bridged tee attenuator, or another type of attenuator.

In various implementations, an exemplary attenuator includes an input terminal; an output terminal; and a plurality of attenuator circuits coupled with the input terminal and the output terminal in series. At least one of the plurality of attenuator circuits includes a first attenuation segment coupled with the input terminal and the output terminal; a second attenuation segment coupled with the first attenuation segment and a voltage reference terminal; and a first switch and a second switch coupled with the input terminal and the output terminal in parallel with the first attenuation segment, wherein a first voltage control terminal is coupled with the first switch and a second voltage control terminal is coupled with the second switch, such that the first voltage control terminal and the second voltage control signal respectively transition the first switch and the second switch from a first state to a second state in a staggered manner. The attenuator can further include a third switch coupled with the second attenuation segment in series, wherein a third voltage control terminal is coupled with the third switch. In various implementations, the first switch, the second switch, and the third switch are field effect transistors.

DETAILED DESCRIPTION OF EXAMPLE EMBODIMENTS

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed.

FIG. 1 is a schematic circuit diagram of an exemplary attenuator 100 according to various aspects of the present disclosure. The attenuator 100 is an electronic device (including an electronic circuit and/or one or more components) configured to decrease a signal property (for example, current, voltage, power, other signal property, or a combination thereof) of an incoming electrical signal. In the depicted embodiment, the attenuator 100 is a variable attenuator that can attenuate an incoming electrical signal to various degrees. FIG. 1 has been simplified for the sake of clarity to better understand the inventive concepts of the present disclosure. Additional features can be added in the attenuator 100, and some of the features described below can be replaced or eliminated in other embodiments of the attenuator 100.

The attenuator 100 has an input terminal 102 that receives an input signal 104 and an output terminal 106 that outputs an output signal 108. An attenuator circuit 110 is coupled with the input terminal 102 and the output terminal 106, such that the attenuator circuit 110 receives and attenuates the input signal 104 according to an attenuation level set by the attenuator 100 to generate the output signal 108 (an attenuated signal). In the depicted embodiment, as further described below, the attenuator circuit 110 can vary the attenuation level applied to the incoming signal 104. The input terminal 102 can be coupled with a source (such as a source circuit), and the output terminal 106 can be coupled with a load (such as a load circuit), where the attenuator circuit 110 reduces a magnitude of the source's signal to an amount suitable for the load. Accordingly, input terminal 102 and output terminal 106 can alternatively be referred to respectively as a source terminal and a load terminal.

The attenuator circuit 110 includes an attenuator section 120. The attenuator section 120 includes an attenuation segment 122 coupled with the input terminal 102 and the output terminal 106, and an attenuator segment 124 coupled with the attenuation segment 122 and a voltage reference terminal 126 (such as a ground terminal). In the depicted embodiment, the attenuation segment 124 is coupled to the voltage reference terminal 126 via a switch device 140 (described below). In furtherance of the depicted embodiment, the attenuator section 120 is a tee attenuator section that includes resistors R1, R2, and R3, where the attenuation segment 122 includes resistor R1 and R2 connected in series between the input terminal 102 and the output terminal 106 (in particular, resistor R1 is coupled with the input terminal 102 and a node 128, and resistor R2 is coupled with the node 128 and the output terminal 106), and the attenuation segment 124 includes resistor R3 coupled with the junction node 128 (between resistors R1 and R2) and the voltage reference terminal 126 (via the switch device 140). In an example, the attenuation segment 122 can be referred to as a series arm of the attenuator section 120, and the attenuation segment 124 can be referred to as a shunt arm of the attenuator section 120. Alternatively, depending on design requirements of the attenuator 100, the attenuator section 120 includes a pi attenuator section, an L attenuator section, a bridged tee attenuator section, other type of attenuator section, or a combination thereof.

The attenuator circuit 110 further includes a switch device 130 and a switch device 140 coupled with the attenuator section 120. The switch device 130 is coupled with the input terminal 102 and the output terminal 106, such that the switch device 130 is also coupled with the attenuation segment 122 (or series arm of the attenuation section 120) in parallel. The switch device 140 is coupled with the attenuation segment 124 (or shunt arm of the attenuation section 120) in series. The switch device 130 includes switch S1, and the switch device 140 includes switches S2, S3, S4, and S5 connected (coupled together) in series. The switch device 140 can include more or less switches (than the four switches S2, S3, S4, and S5) depending on design requirements of the attenuator 100, such design requirements considering any tradeoffs associated with distortion, insertion loss, and/or area of the switches. In the depicted embodiment, the switches S1, S2, S3, S4, and S5 are transistors that include a gate (G) interposed by a source (S) and a drain (D), such as field effect transistors (FETs) (for example, junction gate FETs (JFETs)). Alternatively or additionally, switches S1, S2, S3, S4, and S5 are implemented as PIN diodes, other suitable switching element, or combinations thereof. In the depicted embodiment, switch S1 is coupled with resistors R1 and R2 in parallel (for example, the source of switch S1 is coupled with the resistor R1 at node 132, and the drain of switch S1 is coupled with resistor R2 at node 134), and switches S2, S3, S4, and S5 are coupled with resistor R3 in series (for example, the source of switch S5 is coupled with the voltage reference terminal, the drain of switch S5 is coupled with the source of switch S4, the drain of switch S4 is coupled with the source of switch S3, the drain of switch S3 is coupled with the source of switch S2, and the drain of switch S2 is coupled with resistor R3).

The attenuator circuit 110 further includes a voltage control terminal 142 coupled with switch S1 and a voltage control terminal 144 coupled with switches S2, S3, S4, and S5. In the depicted embodiment, the gate of switch S1 is coupled with the voltage control terminal 142, such that a state of switch S1 is controlled by a voltage control signal 146 (also referred to as a voltage ramp) received via the voltage control terminal 142; and the gates of switches S2, S3, S4, and S5 are coupled with the voltage control terminal 144, such that a state of switches S2, S3, S4, and S5 is controlled by a voltage control signal 148 (also referred to as a voltage ramp) received via the voltage control terminal 144. The voltage control signals 146 and 148 are control (drive) voltages having variable voltage levels, which can be varied from a control voltage minimum to a control voltage maximum. In various implementations, a control signal source for generating the voltage control signal 146 and/or voltage control signal 148 can be a variable DC voltage source.

In operation, by implementing the voltage-controlled switch devices 130 and 140, the attenuator section 120 can generate attenuation levels other than a fixed attenuation level associated with the attenuator section 120. For example, when a variable voltage such as the voltage control signal 146 (a linear voltage ramp, for example) is applied to the switch device 130 and a complementary variable voltage such as the voltage control signal 148 (a complementary linear ramp, for example) is applied to the switch device 140, the attenuator section 120 achieves attenuation levels between a maximum attenuation and a minimum attenuation. The attenuator section 120 achieves maximum attenuation when the switch device 130 is fully off (in other words, the voltage control signal 146 applied to the gate of switch S1 is at the control voltage minimum) and the switch device 140 is fully on (in other words, the voltage control signal 148 applied to the gates of switches S2, S3, S4, and S5 is at the control voltage maximum). The attenuator section 120 achieves minimum attenuation by reversing a polarity of the voltage drive on the gates of the switches S1, S2, S3, S4, and S5: when the switch device 130 is fully on (in other words, the voltage control signal 146 applied to the gate of switch S1 is at the control voltage maximum) and the switch device 140 is fully off (in other words, the voltage control signal 148 applied to the gates of switches S2, S3, S4, and S5 is at the control voltage minimum).

As the control (drive) voltages (generated with opposite voltage ramps of the switch devices 130 and 140 (here, voltage control signals 146 and 148)) start to change the attenuation from the maximum attenuation to an attenuation level between the minimum attenuation and the maximum attenuation, the switch device 130 starts to turn on, introducing some distortion in the attenuator 100. Such distortion increases when a modulated signal (incoming signal 104) is applied to the attenuator section 120 as the switch device 130 turns on. More specifically, in the depicted embodiment, as switch S1 transitions from an off state to a resistive state, and modulated signals are applied to the gate and source of the switch S1 (for example, via the incoming signal 104 and the voltage control signal 146), distortion arises from small changes in the gate to source voltage of switch S1. To mitigate such distortion, the switch S1 preferably has an initially high on resistance ($R_{on\text{-}initial}$). However, to ensure proper attenuation, the attenuator 100 typically requires that switch S1 have a low on resistance ($R_{on\text{-}full}$) when fully on (or when the attenuator is at the minimum attenuation). To achieve a sufficiently low on resistance ($R_{on\text{-}full}$), the attenuator circuit 110 necessitates a larger size of switch S1. However, as the size of switch S1 increases, gate and source capacitance increases, thereby undesirably increasing insertion loss in the attenuator 100. Accordingly, depending on design requirements of the attenuator 100, various tradeoffs ensure that switch S1 exhibits acceptable levels of initial on resistance ($R_{on\text{-}initial}$) and fully on resistance ($R_{on\text{-}full}$), while providing minimal insertion loss and distortion. In the depicted embodiment, the attenuator circuit 110 implements a larger switch size for switch S1 to achieve a sufficiently low fully on resistance ($R_{on\text{-}full}$) and minimum insertion loss. The switch S1 thus has a lower than desirable initial on resistance ($R_{on\text{-}initial}$), leading to higher than desirable distortion.

To mitigate the undesirable distortion arising from switch S1, the attenuator circuit 110 can include resistors connected in series with the gate and a back gate (body) of switch S1. For example, in the depicted embodiment, the gate of switch S1 can be coupled with the voltage control terminal 142 through resistor $R_{G1}$, and a back gate of switch S1 can be coupled with a voltage reference terminal 136 (such as a ground terminal) through resistor $R_{BG1}$. Resistors $R_{G1}$ and $R_{BG1}$ can cause the gate voltage to increase (or decrease) as the input signal 104 increases (or decreases) because the gate to source capacitance pulls up (or down) on the gate voltage, thereby mitigating distortion introduced by a varying signal (incoming signal 104) on the source (or drain) of the switch S1. In furtherance of the depicted embodiment, the gate of switches S2, S3, S4, and S5 can be coupled with the voltage control terminal 144 respectively through resistors $R_{G2}$, $R_{G3}$, $R_{G4}$, and $R_{G5}$, and a back gate of switches S2, S3, S4, and S5 can be coupled with the voltage reference terminal 126 (here, the ground terminal) respectively through resistors $R_{BG2}$, $R_{BG3}$, $R_{BG4}$, and $R_{BG5}$. In various implementations, the resistors $R_{G1}$, $R_{G2}$, $R_{G3}$, $R_{G4}$, and $R_{G5}$ have a resistance higher than an impedance of the respective gate parasitic capacitances, and the resistors $R_{BG1}$, $R_{BG2}$, $R_{BG3}$, $R_{BG4}$, and $R_{BG5}$ have a resistance higher than an impedance of the respective body parasitic capacitances at the operating frequencies of the attenuator 100.

Figure 2:
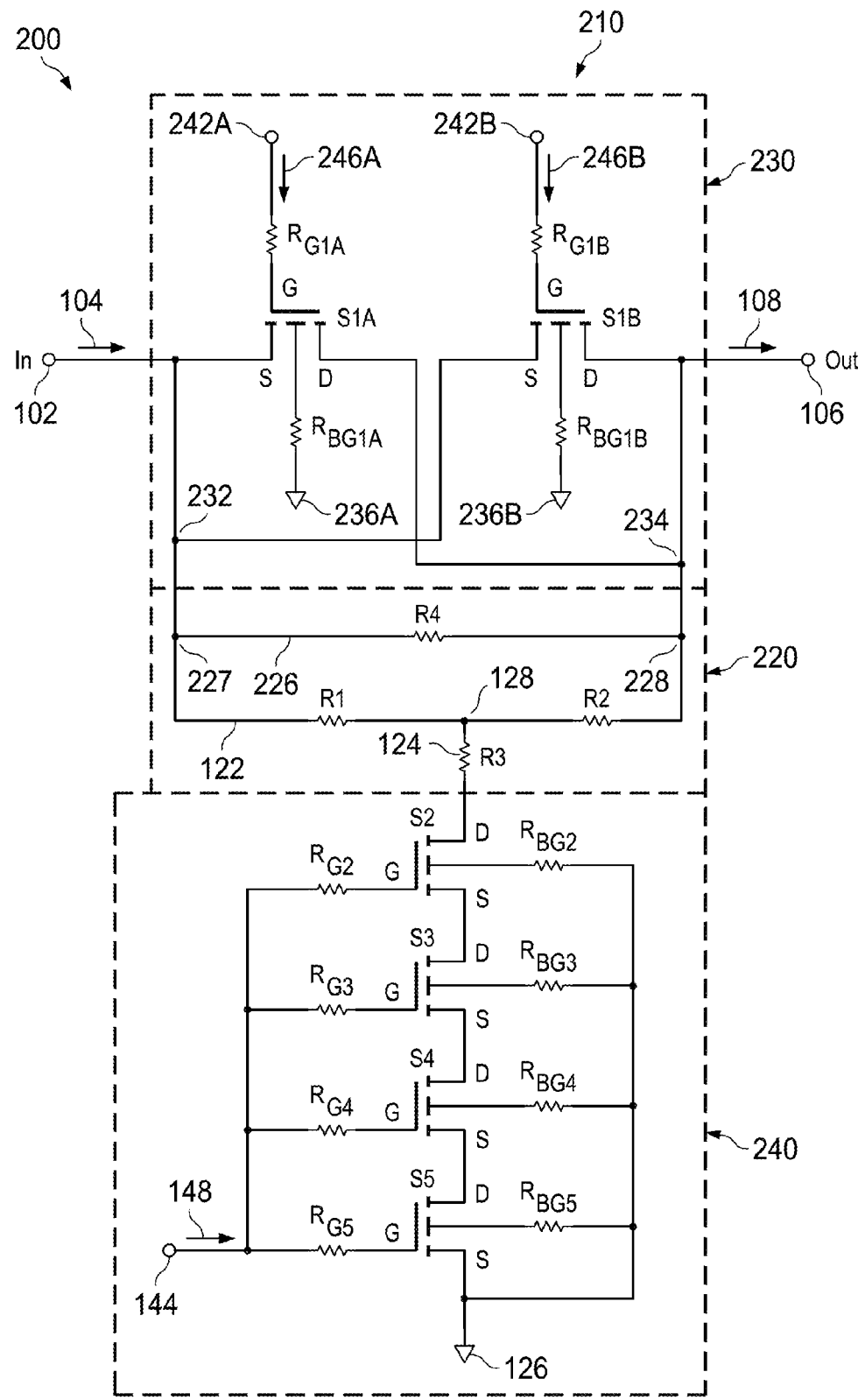
FIG. 2 is a schematic circuit diagram of another exemplary attenuator according to various aspects of the present disclosure.

Though the attenuator 100 provides adequate attenuation with minimal insertion loss, the attenuator 100 still exhibits higher than desirable distortion, even when implementing the various resistors connected in series with the gate and back gate. The present disclosure thus proposes an attenuator that reduces distortion, while maintaining the low fully on resistance ($R_{on\text{-}full}$) and minimum insertion loss exhibited by the attenuator 100. FIG. 2 is a schematic circuit diagram of an exemplary attenuator 200 that exhibits reduced distortion according to various aspects of the present disclosure. The attenuator 200 is an electronic device (including an electronic circuit and/or one or more electronic components) configured to decrease a signal property (for example, current, voltage, power, etc.) of an incoming electrical signal. In the depicted embodiment, the attenuator 200 is a variable attenuator that can attenuate an incoming electrical signal to various degrees. FIG. 2 has been simplified for the sake of clarity to better understand the inventive concepts of the present disclosure. The embodiment of FIG. 2 is similar in many respects to the embodiment of FIG. 1. Accordingly, similar features in FIG. 1 and FIG. 2 are identified by the same reference numerals for clarity and simplicity. Additional features can be added in the attenuator 200, and some of the features described below can be replaced or eliminated in other embodiments of the attenuator 200.

Similar to the attenuator 100, the attenuator 200 has the input terminal 102 that receives the input signal 104 and the output terminal 106 that outputs an output signal 108. The attenuator 200 includes an attenuator circuit 210 coupled with the input terminal 102 and the output terminal 106, such that the attenuator circuit 210 receives and attenuates the input signal 104 according to an attenuation level set by the attenuator 200 to generate the output signal 108 (an attenuated signal). In the depicted embodiment, similar to the attenuator circuit 110, the attenuator circuit 210 can vary the attenuation level applied to the incoming signal 204. However, as described below, in contrast to the attenuator circuit 110, the attenuator circuit 210 is designed and configured to introduce less distortion to the output signal 108, while also introducing low insertion loss levels (similar to those of the attenuator circuit 110).

The attenuator circuit 210 includes an attenuator section 220, which is similar to the attenuator section 120. For example, the attenuator section 220 includes attenuation segment 122 coupled with the input terminal 102 and the output terminal 106, and the attenuation segment 124 coupled with the attenuation segment 122 and the voltage reference terminal 126. In the depicted embodiment, the attenuation segment 124 is coupled to the voltage reference terminal 126 via a switch device 240 (described below). In contrast to the attenuator section 120, the attenuation section 220 further includes an attenuation segment 226 coupled with the attenuation segment 122. Accordingly, in the depicted embodiment, in contrast to the attenuator section 120 (which is a tee attenuator section), the attenuator section 220 is a bridged tee attenuator section that includes resistors R1, R2, R3, and R4, where the attenuation segment 122 includes resistor R1 and R2 connected in series between the input terminal 102 and the output terminal 106 (in particular, resistor R1 is coupled with the input terminal 102 and the node 128, and resistor R2 is coupled with the node 128 and the output terminal 106), the attenuation segment 124 includes resistor R3 coupled with the junction node 128 (between resistors R1 and R2) and the voltage reference terminal 126 (via the switch device 240), and the attenuation segment 226 includes resistor R4 coupled with the attenuation segment 122 (in particular, resistor R4 is coupled with resistor R1 and the input terminal 102 at node 227, and resistor R4 is coupled with resistor R2 and the output terminal 106 at node 228). Alternatively, depending on design requirements of the attenuator 200, the attenuator section 220 includes a pi attenuator section, an L attenuator section, a tee attenuator section (similar to the attenuator section 120), other type of attenuator section, or a combination thereof.

The attenuator circuit 210 further includes a switch device 230, similar in many respects to the switch device 130 of the attenuator circuit 110. For example, the switch device 230 is coupled with the input terminal 102 and the output terminal 106, such that the switch device 230 is coupled with the attenuation segment 122 in parallel. In contrast to the switch device 130, the switch device 230 includes more than one switch, switch S1A and switch S1B. Similar to switch S1, switches S1A and S1B are transistors that include a gate (G) interposed by a source (S) and a drain (D), such as field effect transistors (FETs). In the depicted embodiment, switch S1A and switch S1B are each coupled with resistors R1 and R2 in parallel (for example, the sources of switches S1A and S1B are coupled with the resistor R1 at node 232, and the drains of switches S1A and S1B are coupled with resistor R2 at node 234). Switch S1A and switch S1B are also each coupled with resistor R4 in parallel (for example, the sources of switches S1A and S1B are coupled with the resistor R4 at node 232, and the drains of switches S1A and S1B are coupled with resistor R4 at node 234). In further contrast to the attenuator circuit 110, the attenuator circuit 210 includes a voltage control terminal associated with each switch of the switch device 230. For example, the attenuator circuit 210 includes a voltage control terminal 242A coupled with switch S1A and a voltage control terminal 242B coupled with switch S1B. In the depicted embodiment, the gate of switch S1A is coupled with the voltage control terminal 242A, such that a state of switch S1A is controlled by a voltage control signal 246A (also referred to as a voltage ramp) received via the voltage control terminal 242A; and the gate of switch S1B is coupled with the voltage control terminal 242B, such that a state of switch S1B is controlled by a voltage control signal 246B (also referred to as a voltage ramp) received via the voltage control terminal 242B. In implementations where there are more than two switches, the attenuator circuit 210 includes at least two voltage control terminals, where each switch is associated with one of the at least two voltage control terminals.

The attenuator circuit 210 further includes a switch device 240, similar in many respects to the switch device 140 of the attenuator circuit 110. Similar to the switch device 140, the switch device 240 is coupled with the attenuation segment 124 in series. The switch device 240 includes the switches S2, S3, S4, and S5 connected (coupled together) in series. The switch device 240 can alternatively include more or less switches (than the four switches S2, S3, S4, and S5) depending on design requirements of the attenuator 200, such design requirements considering any tradeoffs associated with distortion, insertion loss, and/or area of the switches. In the depicted embodiment, similar to the switch device 140, the switches S2, S3, S4, and S5 are transistors that include a gate (G) interposed by a source (S) and a drain (D), such as field effect transistors (FETs). Similar to the attenuator circuit 110, the attenuator circuit 210 includes the voltage control terminal 144 coupled with switches S2, S3, S4, and S5. In the depicted embodiment, the gates of switches S2, S3, S4, and S5 are coupled with the voltage control terminal 144, such that a state of switches S2, S3, S4, and S5 is controlled by the voltage control signal 148 (also referred to as a voltage ramp) received via the voltage control terminal 144. Similar to the attenuator circuit 110, in the attenuator circuit 210, the voltage control signals 246A, 246B, and 148 are control (drive) voltages having variable voltage levels, which can be varied from a control voltage minimum to a control voltage maximum. In various implementations, a control signal source for generating voltage control signal 246A, voltage control signal 246B, and/or voltage control signal 148 can be a variable DC voltage source.

In operation, by implementing the voltage-controlled switch devices 230 and 240, the attenuator section 220 can generate attenuation levels other than a fixed attenuation level associated with the attenuator section 220. For example, when variable voltages, such as the voltage control signal 246A (a linear voltage ramp, for example) and the voltage control signal 246B (another linear voltage ramp, for example), is applied to the switch device 230 and a complementary variable voltage such as the voltage control signal 148 (a complementary linear ramp, for example) is applied to the switch device 240, the attenuator section 220 achieves attenuation levels between a maximum attenuation and a minimum attenuation. The attenuator section 220 achieves maximum attenuation when the switch device 230 is fully off (in other words, the voltage control signal 246A applied to the gate of switch S1A is at the control voltage minimum, and the voltage control signal 246B applied to the gate of switch S1B is at the control voltage minimum) and the switch device 240 is fully off (in other words, the voltage control signal 148 applied to the gates of switches S2, S3, S4, and S5 is at the control voltage maximum). The attenuator section 220 achieves minimum attenuation by reversing a polarity of the voltage drive on the gates of the switches S1, S2, S3, S4, and S5: when the switch device 230 is fully on (in other words, the voltage control signal 246A applied to the gate of switch S1A is at the control voltage maximum, and the voltage control signal 246B applied to the gate of switch S1B is at the control voltage maximum) and the switch device 240 is fully off (in other words, the voltage control signal 148 applied to the gates of switches S2, S3, S4, and S5 is at the control voltage minimum).

As the control (drive) voltages (generated with opposite voltage ramps of the switch devices 230 and 240 (here, voltage control signals 246A, 246B, and 148)) start to change the attenuation from the maximum attenuation to an attenuation level between the minimum attenuation and the maximum attenuation, the switch device 230 starts to turn on, introducing some distortion. However, when compared to the switch device 130 of the attenuator circuit 110, the switch device 230 of the attenuator circuit 210 significantly reduces such distortion, particularly the distortion arising from the initial turn on of the switch device 230 (when switch S1A and switch S1B transition from an off state to a resistive state). As described above, the switch device 230 includes more than one switch, switch S1A and switch S1B, coupled with the attenuation segment 122 in parallel between the input terminal 102 and the output terminal 106. A size of switches S1A and S1B in switch device 230 is smaller than a size of the single switch S1 in the switch device 130, such that switches S1A and S1B exhibit an initial on resistance ($R_{on\text{-}initial}$) that is higher than the initial on resistance ($R_{on\text{-}initial}$) of switch S1, which is more fully described below. In various implementations, switch S1A and switch S1B are about half the size of switch S1 (in an example, switch S1 in attenuator 100 can be about 600μ, and switch S1A and switch S1B can each be about 300μ). Switch S1A and switch S1B can have a different size than about half the size of switch S1. Further, in various implementations, switch S1A has a same size and/or resistance characteristic as switch S1B, or alternatively, switch S1A has a different size and/or resistance characteristic as switch S1B. In implementations where the switch device 230 includes more than two switches, the switches can have a same size and/or resistance characteristic or varying sizes and/or resistance characteristics.

The present disclosure recognizes that such distortion reduction results from having the switch device 230 include multiple switches having smaller sizes relative to the switch S1 of the switch device 130. For example, assume that the resistance from node 227 to node 228 is about 10Ω and that, as switch S1A starts to turn on, the switch S1A's initial on resistance is in about the mega ohm range. As this on resistance (in parallel with the attenuator section 220) is varied by the input signal 104 from about 10 MΩ to about 1 MΩ, the resistance of the attenuator section 220 is still approximately 10Ω (assuming the resistance from node 227 to node 228 is about 10Ω). As the switch turns on a little more, variation of the input signal 104 imposed at input terminal 102 is still large compared to the gate to source voltage (voltage control signal 246A) imposed on the gate of switch S1A. This impedance variation in parallel with the comparatively low resistance of the attenuator section 220 (in the present example, about 10Ω) is not insignificant. In particular, the present disclosure recognizes that if the on resistance from the input terminal 102 to the output terminal 106 is large compared to resistance of the attenuator section 220, less distortion arises in the attenuator. So, making switch S1A smaller than switch S1 increases the initial on resistance, so that as the DC value of the gate to source voltage gets larger, the modulating signal is a smaller portion of the total gate to source voltage. Accordingly, the on resistance change is reduced in this particular area of the attenuator's operation. When the DC portion of the gate to source voltage is relatively low, the on resistance of the switch S1A is higher, and the channel resistance's effect on attenuator section 220 is smaller. Thus, using more switches (here, switch S1A and switch S1B) increases the impedance in the region that the modulation voltage has a larger effect on the switch's on resistance and a smaller effect on the attenuator's distortion.

In the depicted embodiments, because switches S1A and S1B are smaller than switch S1, the initial on resistance ($R_{on\text{-}initial}$) of switches S1A and S1B is larger than the initial on resistance ($R_{on\text{-}initial}$) of switch S1, and thereby the distortion arising when switch S1A and switch S1B initially turn on (transitioned from their off state to their resistive state) is lower than the distortion arising when the switch S1 of the switch device 130 initially turns on. In the present example, where switch device 230 includes two switches (switch S1A and switch S1B) instead of one (such as switch S1 in switch device 130 in attenuator 100), and each switch in switch device 230 is about half the size of the switch in switch device 130, as a first order approximation, the initial on resistance of each switch (switch S1A and switch S1B) of the switch device 230 will be about twice the initial on resistance of the single switch (switch S1) of the switch device 130. Further, because multiple switches (here, switch S1A and switch S1B) are implemented in the switch device 230, and the multiple switches are coupled in parallel with the attenuator section 220, the on resistance of each of the switches is a smaller portion of a total resistance of the attenuator circuit 210, such that a fully on resistance ($R_{on\text{-}full}$) of the multiple switches of the switch device 230 remains low. For example, in various implementations, the switches of the switch device 230 (here, switch S1A and switch S1B) are designed and configured to have a fully on resistance ($R_{on\text{-}full}$) that is equal to the fully on resistance ($R_{on\text{-}full}$) of the single switch S1 in the switch device 130. The attenuator 200 can thus achieve minimal insertion loss as well as minimal distortion.

In operation, transitioning the switches of the switch device 230 from an off state to an on state (in particular, from an off state to a resistive state) occurs in a staggered manner. For example, in the depicted embodiment, the voltage control signal 246B for turning on the switch S1B is delayed until the voltage control signal 246A turns on the switch S1A. In various implementations, voltage control signal 246A begins turning on switch S1A, and once switch S1A reaches its resistive state, voltage control signal 246B begins turning on switch S1B. Since an initial on resistance ($R_{on\text{-}initial}$) of switch S1A is sufficiently large enough to reduce distortion that occurs as it initially transitions to its on state, an initial on resistance ($R_{on\text{-}initial}$) of switch S1B is sufficiently large enough to reduce distortion that occurs as it initially transitions to its on state, and switch S1A and switch S1B are transitioned to their respective on states in a staggered manner, total distortion of the attenuator 200 is reduced when compared to the attenuator 100, as further described below with reference to FIG. 3.

Figure 3:
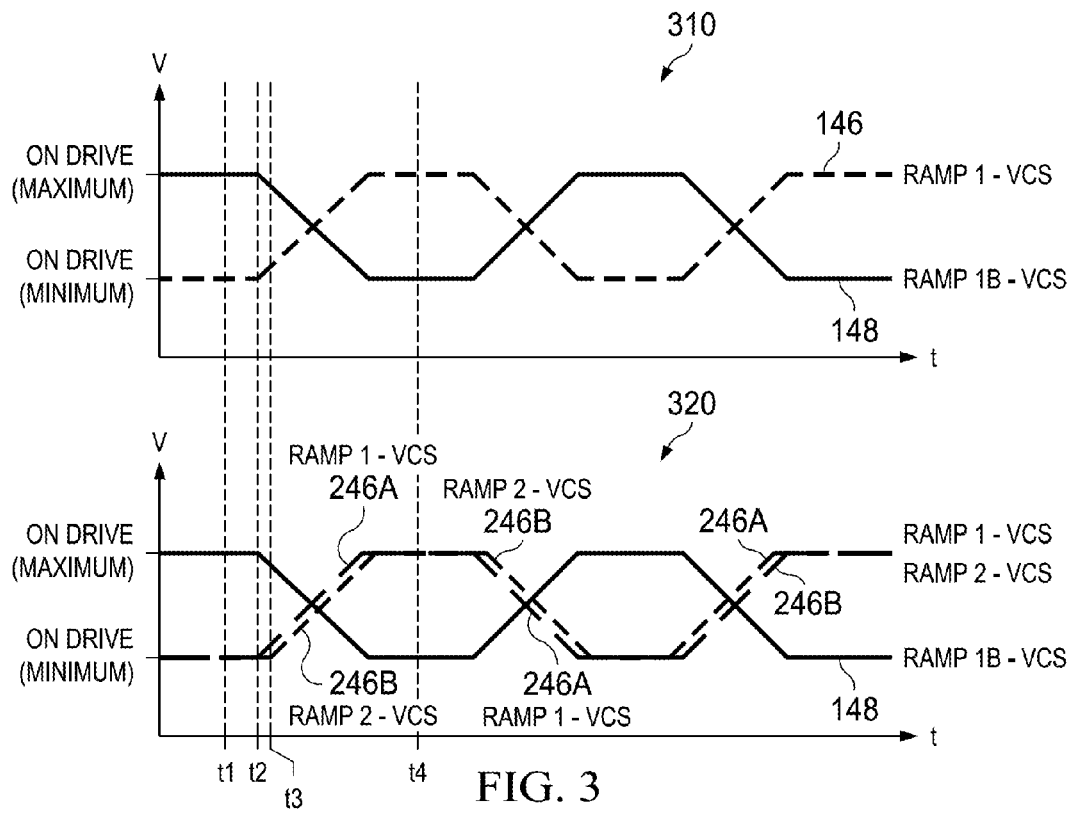
FIG. 3 includes schematic diagrams illustrating how voltage ramps can be applied to an attenuator, such as the attenuator of FIG. 1 and the attenuator of FIG. 2, to achieve various levels of attenuation according to various aspects of the present disclosure.

FIG. 3 include schematic diagrams illustrating how voltage ramps applied to the attenuator 100 and the attenuator 200 can vary over time according to various aspects of the present disclosure. For example, in FIG. 3, a schematic diagram 310 illustrates how a voltage RAMP 1 (associated with the voltage control signal 146) and a voltage RAMP 1B (associated with voltage control signal 148) can be respectively applied to switch device 130 and switch device 140 to achieve various levels of attenuation by the attenuator 100; and a schematic diagram 320 illustrates how a voltage RAMP 1 (associated with the voltage control signal 246A), a voltage RAMP 2 (associated with the voltage control signal 246B), and a voltage RAMP 1B (associated with the voltage control signal 148) can be respectively applied to switch device 230 and switch device 240 to achieve various levels of attenuation by the attenuator 200. FIG. 3 has been simplified for the sake of clarity to better understand the inventive concepts of the present disclosure.

At time t1, the attenuator 100 achieves maximum attenuation because switch device 130 is fully off and switch device 140 is fully on: the voltage control signal 146 (Ramp 1) applied to switch S1 is at the control voltage minimum, and the voltage control signal 148 (Ramp 1B) applied to switches S2, S3, S4, and S5 is at the control voltage maximum. Similarly, at time t1, the attenuator 200 achieves maximum attenuation at time t1 because switch device 230 is fully off and switch device 240 is fully on: the voltage control signal 246A (Ramp 1) applied to switch S1A is at the control voltage minimum, the voltage control signal 246B (Ramp 2) applied to switch S1B is at the control voltage minimum, and the voltage control signal 148 (Ramp 1B) applied to switches S2, S3, S4, and S5 is at the control voltage maximum.

At time t2 and time t3, the attenuator 200 operates differently than the attenuator 100, such that the attenuator 200 exhibits less distortion than the attenuator 100. For example, at time t2, the attenuator 100 starts transitioning switch 130 from the off state to an on state and switch 140 from the on state to the off state: the voltage control signal 146 (Ramp 1) applied to switch S1 is increased from the control voltage minimum, and the voltage control signal 148 (Ramp 1B) applied to switches S2, S3, S4, and S5 is decreased from the control voltage maximum. The attenuator 200 also starts transitioning switch 230 from the off state to an on state and switch 240 from the on state to the off state: the voltage control signal 246A (Ramp 1) applied to switch S1A is increased from the control voltage minimum, the voltage control signal 246B (Ramp 2) applied to switch S1B remains at the control voltage minimum, and the voltage control signal 148 (Ramp 1B) applied to switches S2, S3, S4, and S5 is decreased from the control voltage maximum. Then, at time t3, when switch S1A has transitioned into its resistive state, the attenuator 200 begins transitioning switch S1B from the off state to the on state: the voltage control signal 246A (Ramp 1) applied to switch S1A is increased further from the control voltage minimum, the voltage control signal 246B (Ramp 2) applied to switch S1B is increased from the control voltage minimum, and the voltage control signal 148 (Ramp 1B) applied to switches S2, S3, S4, and S5 is further decreased from the control voltage maximum. It is noted that, in the depicted embodiment, switch S1A is turned on, and then switch S1B is turned on, and subsequently (at a time after t4), switch S1A is turned off, and then switch S1B is turned off. Alternatively, switch S1B can be turned on and/or off first, and then switch S1A can be turned on and/or off, so long as one switch is turned on and/or off slightly before the other switch. Such staggering of on/off states is also implemented when the switch device 230 has more than two switches, so that one switch is turned on and/or off slightly before another switch.

At time t4, the attenuator 100 achieves minimum attenuation because switch device 130 is fully on and switch device 140 is fully off: the voltage control signal 146 (Ramp 1) applied to switch S1 is at the control voltage maximum, and the voltage control signal 148 (Ramp 1B) applied to switches S2, S3, S4, and S5 is at the control voltage minimum. Similarly, the attenuator 200 achieves minimum attenuation at time t4 because switch device 230 is fully on and switch device 240 is fully off: the voltage control signal 246A (Ramp 1) applied to switch S1A is at the control voltage maximum, the voltage control signal 246B (Ramp 2) applied to switch S1B is at the control voltage maximum, and the voltage control signal 148 (Ramp 1B) applied to switches S2, S3, S4, and S5 is at the control voltage minimum. At various points between time t2, time t3, and time t4, attenuator 100 and attenuator 200 achieve various levels of attenuation between the maximum attenuation and the minimum attenuation.

Returning to FIG. 2, to further mitigate the distortion of switch S1A and switch S1B, similar to the attenuator circuit 110, the attenuator circuit 210 can include resistors connected in series with the gate and a back gate (body) of switch S1A and switch S1B. For example, in the depicted embodiment, the gate of switch S1A can be coupled with the voltage control terminal 242A through resistor $R_{G1A}$, a back gate of switch S1A can be coupled with a voltage reference terminal 236A (such as a ground terminal) through resistor $R_{BG1A}$, the gate of switch S1B can be coupled with the voltage control terminal 242B through resistor $R_{G1B}$, and a back gate of switch S1B can be coupled with a voltage reference terminal 236B (such as a ground terminal) through resistor $R_{BG1B}$. In furtherance of the depicted embodiment, the gates of switches S2, S3, S4, and S5 can be coupled with the voltage control terminal 144 respectively through resistors $R_{G2}$, $R_{G3}$, $R_{G4}$, and $R_{G5}$, and the back gate of switches S2, S3, S4, and S5 can be coupled with the voltage reference terminal 126 (here, the ground terminal) respectively through resistors $R_{BG2}$, $R_{BG3}$, $R_{BG4}$, and $R_{BG5}$. In various implementations, the resistors $R_{G1A}$, $R_{G1B}$, $R_{G2}$, $R_{G3}$, $R_{G4}$, and $R_{G5}$ have a resistance higher than an impedance of the gate parasitic capacitances, and the resistors $R_{BG1A}$, $R_{BG1B}$, $R_{BG2}$, $R_{BG3}$, $R_{BG4}$, and $R_{BG5}$ have a resistance higher than an impedance of the body parasitic capacitances at the operating frequencies of the attenuator 200.

Figure 4:
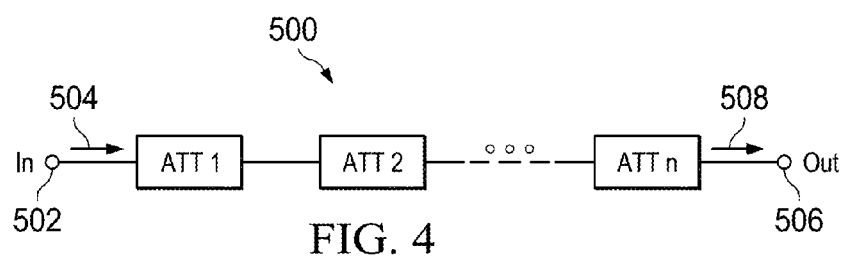
FIG. 4 is a schematic block diagram of an exemplary attenuator according to various aspects of the present disclosure.

FIG. 4 is a schematic block diagram of an exemplary attenuator 500 according to various aspects of the present disclosure. The attenuator 500 is an electronic device (including an electronic circuit and/or one or more components) configured to decrease a signal property (for example, current, voltage, power, other signal property, or a combination thereof) of an incoming electrical signal. In the depicted embodiment, the attenuator 500 is a variable attenuator that can attenuate an incoming electrical signal to various degrees. FIG. 5 has been simplified for the sake of clarity to better understand the inventive concepts of the present disclosure. Additional features can be added in the attenuator 500, and some of the features described below can be replaced or eliminated in other embodiments of the attenuator 500.

The attenuator 500 has an input terminal 502 that receives an input signal 504 and an output terminal 506 that outputs an output signal 508. The attenuator 500 further includes multiple attenuator circuits cascaded in series between the input terminal 502 and the output terminal 506, such that the attenuator circuits receive and attenuate the input signal 504 according to an attenuation level set by the attenuator 500 to generate the output signal 508 (an attenuated signal). In the depicted embodiment, the multiple attenuator circuits cascaded in series includes attenuator circuit 1, attenuator circuit 2, . . . and attenuator circuit n coupled with the input terminal 502 and the output terminal 506, where n is a total number of attenuator circuits cascaded in series between the input terminal 502 and the output terminal 506. The attenuator circuit 1, attenuator circuit 2, . . . and/or attenuator circuit n can vary the attenuation level applied to the incoming signal 504. The input terminal 502 can be coupled with a source (such as a source circuit), and the output terminal 506 can be coupled with a load (such as a load circuit), where the attenuator circuits (here, attenuator circuit 1, attenuator circuit 2, . . . and attenuator circuit n) reduce a magnitude of the source's signal to an amount suitable for the load. Accordingly, input terminal 502 and output terminal 506 can alternatively be referred to respectively as a source terminal and a load terminal.

The attenuator circuit 1, attenuator circuit 2, . . . and/or attenuator circuit n can be similar to the attenuator 100, the attenuator 200, another type of an attenuator circuit, or a combination thereof. For example, in the depicted embodiment, each of the attenuator circuit 1, attenuator circuit 2, . . . and/or attenuator circuit n are similar to the attenuator circuit 200. In an exemplary operation, by cascading attenuator circuits similar to the attenuator circuit 200 and turning on each of the attenuator circuits in a chain mode (using linear ramps for attenuator circuit 1, attenuator circuit 2, . . . and/or attenuator circuit n), the attenuator 500 exhibits minimal distortion, while retaining low fully on resistance (for example, at minimum attenuation) and minimal insertion loss.

In various implementations, attenuator 100, attenuator 200, and attenuator 500 of the FIGURES can be coupled with a motherboard of an associated electronic device or system.

The motherboard can be a general circuit board that can hold various components of an internal electronic system of the electronic device and, further, provide connectors for other peripherals. More specifically, the motherboard can provide the electrical connections by which the other components of the system can communicate. Any suitable processors (inclusive of digital signal processors, microprocessors, supporting chipsets, etc.), memory elements, etc. can be suitably coupled with the motherboard based on a particular configuration needs, processing demands, computer designs, other considerations, or a combination thereof. Other components, such as external storage, controllers for videos display, sound, and peripheral devices may be attached to the motherboard as plug-in cards, via cables, or integrated into the motherboard itself.

In various implementations, attenuator 100, attenuator 200, and attenuator 500 of the FIGURES can be embedded in stand-alone modules (for example, a device with associated components and circuitry configured to perform a specific application or function) or integrated as plug-in modules into application specific hardware of electronic devices. Note that particular embodiments of the present disclosure may be readily included in a system-on-chip (SOC) package. An SOC represents an integrated circuit that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In other embodiments, the attenuation functions described herein may be implemented in one or more semiconductor cores (such as silicon cores) in application specific integrated circuits (ASICs), field programmable gate arrays (FPGAs), other semiconductor chips, or combinations thereof.

The specifications, dimensions, and relationships outlined herein have only been offered for purposes of example and teaching only. Each of these may be varied considerably without departing from the spirit of the present disclosure, or the scope of the appended claims. The specifications apply only to non-limiting examples and, accordingly, they should be construed as such. In the foregoing description, example embodiments have been described with reference to particular component arrangements. Various modifications and changes may be made to such embodiments without departing from the scope of the appended claims. The description and drawings are, accordingly, to be regarded in an illustrative rather than a restrictive sense. Further, the operations and steps described with reference to the preceding FIGURES illustrate only some of the possible scenarios that may be executed by, or within, the various apparatuses, processors, devices, and/or systems, described herein. Some of these operations may be deleted or removed where appropriate, or these steps may be modified or changed considerably without departing from the scope of the discussed concepts. In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "steps for" are specifically used in the particular claims; and (b) does not intend, by any statement in the specification, to limit this disclosure in any way that is not otherwise reflected in the appended claims.

What is claimed is:

1. An attenuator comprising:
an input terminal;
an output terminal;
a voltage reference terminal;
a first attenuation segment coupled with the input terminal and the output terminal;
a second attenuation segment coupled with the first attenuation segment and the voltage reference terminal;
a first switch and a second switch coupled with the input terminal and the output terminal in parallel with the first attenuation segment, wherein a first voltage control terminal is coupled with the first switch and a second voltage control terminal is coupled with the second switch; and
a third switch coupled with the second attenuation segment in series, wherein a third voltage control terminal is coupled with the third switch, wherein the first switch, second switch, and third switch are configured to receive a voltage ramp control signal via respective first voltage control terminal, second voltage control terminal, and third voltage control terminal to achieve attenuation levels between a maximum attenuation and a minimum attenuation.

2. The attenuator of claim 1 wherein a first voltage ramp control signal is applied to the first switch via the first voltage control terminal, a second voltage ramp control signal is applied to the second switch via the second voltage control terminal, and a third voltage ramp control signal is applied to the third switch via the third voltage control terminal, the third voltage ramp control signal is complementary to the first voltage ramp control signal and the second voltage ramp control signal.

3. The attenuator of claim 1 wherein the first switch, the second switch, and the third switch are field effect transistors.

4. The attenuator of claim 1 configured such that the first voltage control terminal and the second voltage control terminal respectively transition the first switch and the second switch from a first state to a second state in a staggered manner.

5. The attenuator of claim 1 wherein a gate of the third switch is coupled with the third voltage control terminal through a resistor, and a back gate of the third switch is coupled with the voltage reference terminal through a resistor.

6. The attenuator of claim 1 further including at least one more switch coupled with the second attenuation segment in series, wherein the at least one more switch is coupled with the third voltage control terminal.

7. The attenuator of claim 1 wherein a gate of the first switch is coupled with the first voltage control terminal through a resistor, and a gate of the second switch is coupled with the second voltage control terminal through a resistor.

8. The attenuator of claim 7 wherein a back gate of the first switch is coupled with a first voltage reference terminal through a resistor, and a back gate of the second switch is coupled with a second voltage reference terminal through a resistor.

9. The attenuator of claim 1 wherein the first attenuation segment and the second attenuation segment are a portion of one of a tee attenuator section, a pi attenuator section, and a bridged tee attenuator section, or other type of attenuator section.

10. The attenuator of claim 1 wherein the voltage reference terminal is a ground terminal.

11. An integrated circuit comprising:
an input terminal;
an output terminal;
an attenuator circuit coupled with the input terminal and the output terminal, wherein the attenuator circuit includes:
a first attenuation segment coupled with the input terminal and the output terminal;
a second attenuation segment coupled with the first attenuation segment and a voltage reference terminal; and
a first switch device coupled between the input terminal and the output terminal in parallel with the first attenuation segment, wherein the first switch device includes at least two switches, wherein the at least two switches have respective voltage control terminals, wherein the attenuator circuit is configured such that a voltage control signal received via the respective voltage control terminals transition the at least two switches from a first state to a second state in a staggered manner; and
a second switch device coupled with the second attenuation segment in series.

12. The integrated circuit of claim 11 wherein the voltage control terminals transition the at least two switches from a first state to a second state in a staggered manner to vary an on resistance of the at least two switches.

13. The integrated circuit of claim 11 wherein the at least two switches are field effect transistors.

14. The integrated circuit of claim 11 wherein the second switch device is coupled with a respective voltage control terminal, wherein the attenuator circuit is configured such that a complementary voltage control signal is received via the respective voltage control terminal.

15. The integrated circuit of claim 14 wherein the voltage control terminals are configured to respectively apply a variable voltage to the at least two switches and the second switch device to achieve attenuation levels between a maximum attenuation and a minimum attenuation.

16. The integrated circuit of claim 11 wherein the attenuator section is one of a pi attenuator, a tee attenuator, and a bridged tee attenuator.

17. The integrated circuit of claim 11 further including a source circuit and a load circuit, wherein the attenuator circuit outputs an output signal to the load circuit that is attenuated relative to an incoming signal received from the source circuit.

18. An attenuator comprising:
an input terminal;
an output terminal;
a plurality of attenuator circuits coupled with the input terminal and the output terminal in series, wherein at least one of the plurality of attenuator circuits includes:
a first attenuation segment coupled with the input terminal and the output terminal;
a second attenuation segment coupled with the first attenuation segment and a voltage reference terminal; and
a first switch and a second switch coupled with the input terminal and the output terminal in parallel with the first attenuation segment, wherein a first voltage control terminal is coupled with the first switch and a second voltage control terminal is coupled with the second switch, such that the first voltage control terminal and the second voltage control terminal respectively transition the first switch and the second switch from a first state to a second state in a staggered manner; and
a third switch coupled with the second attenuation segment in series, wherein a third voltage control terminal is coupled with the third switch.

19. The attenuator of claim 18 wherein the first voltage control terminal, the second voltage control terminal, and the third voltage control terminal are configured to respectively apply a variable voltage to the first switch, the second switch, and the third switch to achieve attenuation levels between a maximum attenuation and a minimum attenuation.

20. The attenuator of claim 18 wherein the first switch, the second switch, and the third switch are field effect transistors.

* * * * *